(12) United States Patent
Chang (10) Patent No.: US 7,710,815 B2
(45) Date of Patent: May 4, 2010

(54) ACCESS UNIT FOR A STATIC RANDOM ACCESS MEMORY

(75) Inventor: Meng-Fan Chang, Taipei (TW)

(73) Assignee: National Tsing Hua University, Hsinchu (TW)

( * ) Notice: Subject to any disclaimer, the term of this patent is extended or adjusted under 35 U.S.C. 154(b) by 61 days.

(21) Appl. No.: 12/245,887

(22) Filed: Oct. 6, 2008

(65) Prior Publication Data

US 2009/0103377 A1  Apr. 23, 2009

(30) Foreign Application Priority Data

Oct. 23, 2007  (TW) .............................. 96139652 A (51) Int. Cl.
*G11C 8/00* (2006.01)
*G11C 11/00* (2006.01)

(52) U.S. Cl. .................................. 365/230.05; 365/154

(58) Field of Classification Search ............ 365/230.05, 365/154, 156

See application file for complete search history.

(56) References Cited

U.S. PATENT DOCUMENTS

| 6,724,648 B2 * | 4/2004 | Khellah et al. .............. 365/154 |
| 7,447,058 B2 * | 11/2008 | Maki et al. .................. 365/154 |
| 7,492,627 B2 * | 2/2009 | Russell et al. ............... 365/154 |
| 2006/0098475 A1 * | 5/2006 | Ohtake et al. ............... 365/154 |

* cited by examiner

*Primary Examiner*—Anh Phung
(74) *Attorney, Agent, or Firm*—Holland & Knight LLP; Brian J. Colandreo, Esq.

(57) ABSTRACT

An access unit for a static random access memory (SRAM) is provided. The access unit comprises two inverters. Two different variable voltages are supplied to the two inverters via bitlines to cause an imbalance in the current strengths between the two inverters so that data can be written on the SRAM.

9 Claims, 6 Drawing Sheets

ACCESS UNIT FOR A STATIC RANDOM ACCESS MEMORY

RELATED APPLICATION

This application claims priority to Taiwan Patent Application No. 096139652 filed on 23 Oct. 2007, the contents of which are incorporated herein by reference in its entirety.

BACKGROUND OF THE INVENTION

1. Field of the Invention

The present invention relates to an access unit. More specifically, the present invention relates to an access unit for a static random access memory (SRAM).

2. Descriptions of the Related Art

Static random access memories (SRAMs) are often used in large quantities in system-on-chips (SOCs). To reduce the power consumption of mobile apparatuses using SOCs, the SOCs therein usually have only a single voltage as a power supply (VDD). If the supply voltage is excessively low when the data is written into an SRAM, the write operations often fail in the SRAM, which means that it is impossible to successfully alter the data stored in the SRAM access unit.

Figure 1:
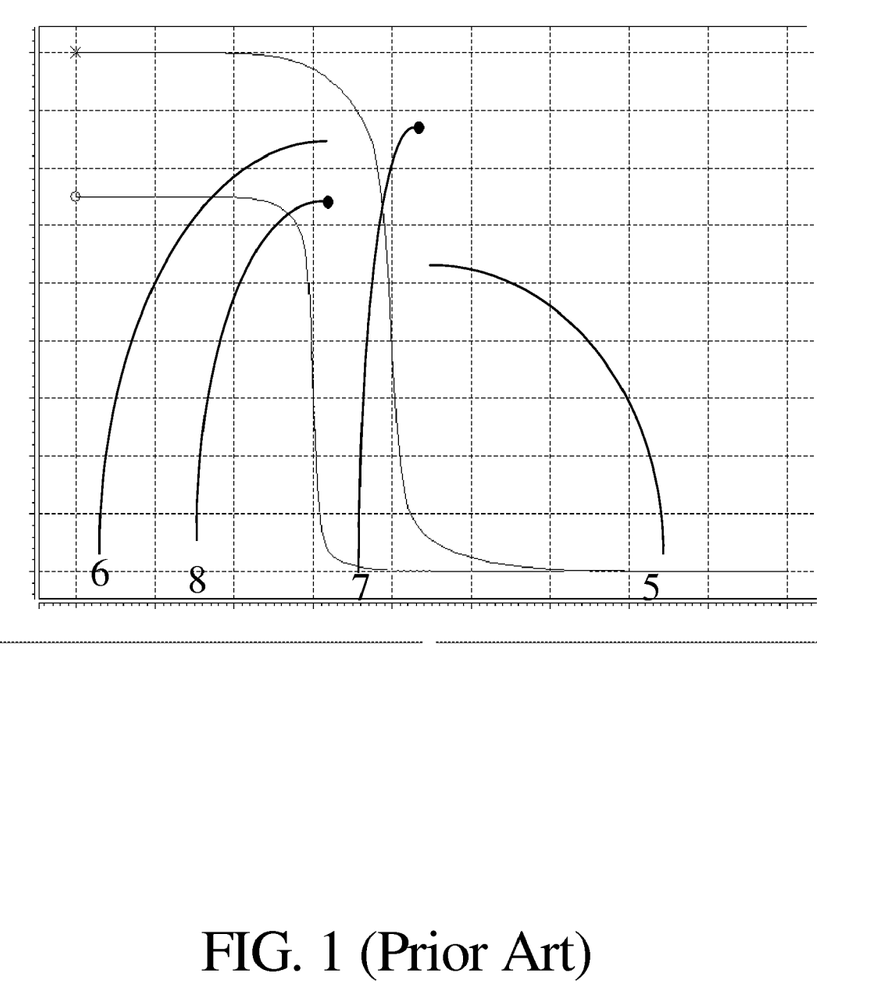
FIG. 1 illustrates a oscillogram of an output or an input signal of a conventional inverter.

FIG. 1 is an oscillogram illustrating the variation of an output or an input signal of a conventional inverter. In this embodiment, curves 5 and 6 represent the variation of an output signal when the inverter is supplied with different supply voltages respectively, in which a supply voltage represented by the curve 5 is higher than that represented by the curve 6. Because the converter generally wavers between a high voltage level and a low voltage level, the midpoint of an output signal variation curve thereof is defined as an inverter trip point, for example, the curve 5 has a trip point 7 and the curve 6 has a trip point 8. In other words, the voltage below the trip point is considered as the low voltage level, while the voltage above the trip point is considered as the high voltage level. Because the supply voltage represented by the curve 5 is higher than that represented by the curve 6, the trip point 7 has a larger value than that of trip point 8.

Figure 2A:
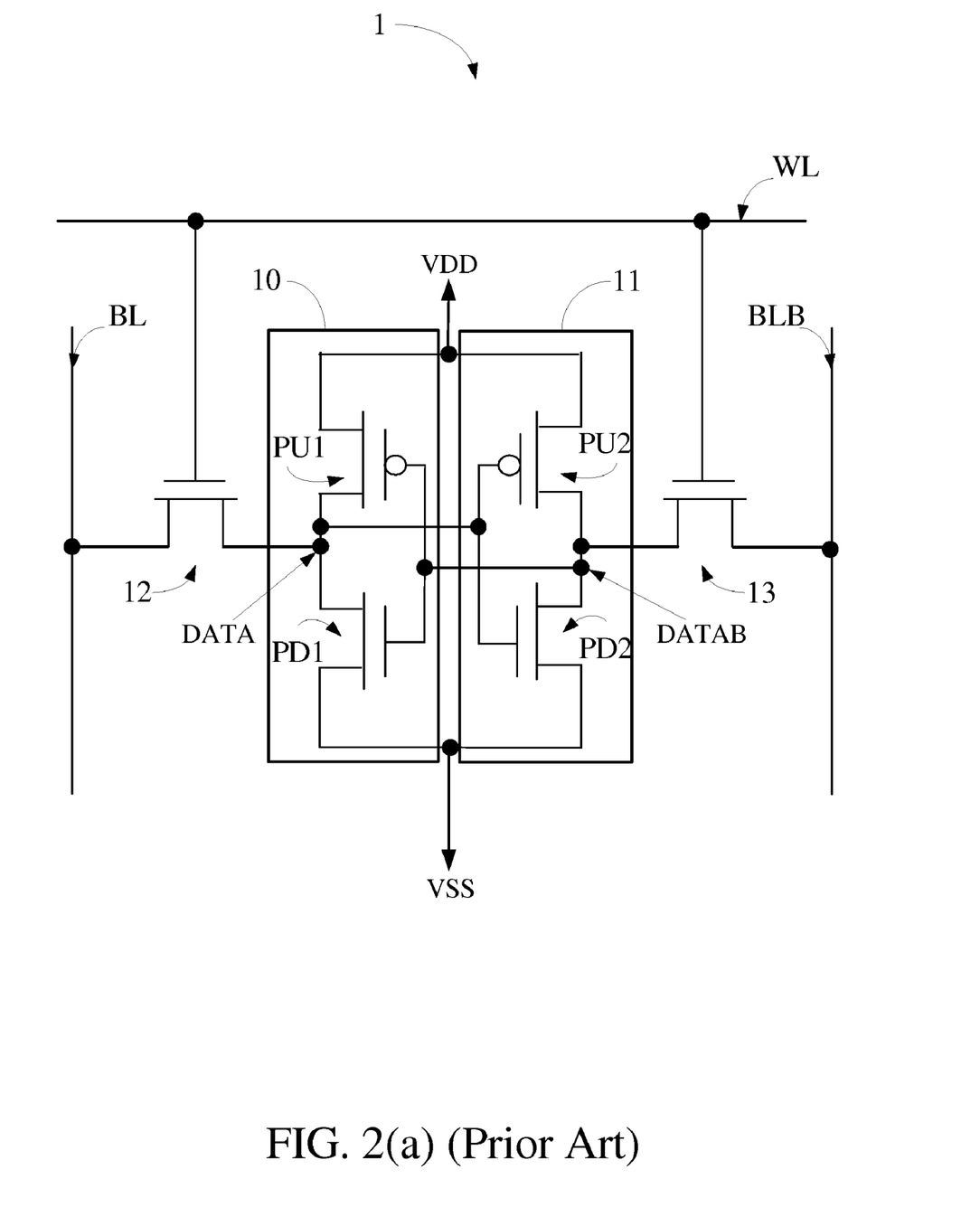
FIG. 2(a) illustrates a schematic circuit diagram of a conventional SRAM access unit.

FIG. 2(a) illustrates a schematic circuit diagram of a conventional SRAM access unit 1. The access unit 1 has a supply voltage VDD and a lowest voltage VSS respectively. The SRAM access unit 1 comprises two cross-coupled inverters 10, 11 configured to store data therein and two pass transistors 12, 13. The output terminal of the cross-coupled inverter 10 is connected with the input terminal of the cross-coupled inverter 11 to carry a voltage denoted as the node voltage DATA. On the other hand, the input terminal of the cross-coupled inverter 10 is connected with the output terminal of the cross-coupled inverter 11 to carry a voltage denoted as the node voltage DATAB. The pass transistors 12 and 13 are configured to electrically connect the cross-coupled inverters 10, 11 to bitlines BL and BLB respectively. The bitlines BL and BLB are opposite in phase to each other at all times, for example, when BL stays at a high logic level of "1", BLB stays at a low logic level of "0", and vice versa.

Figure 2B:
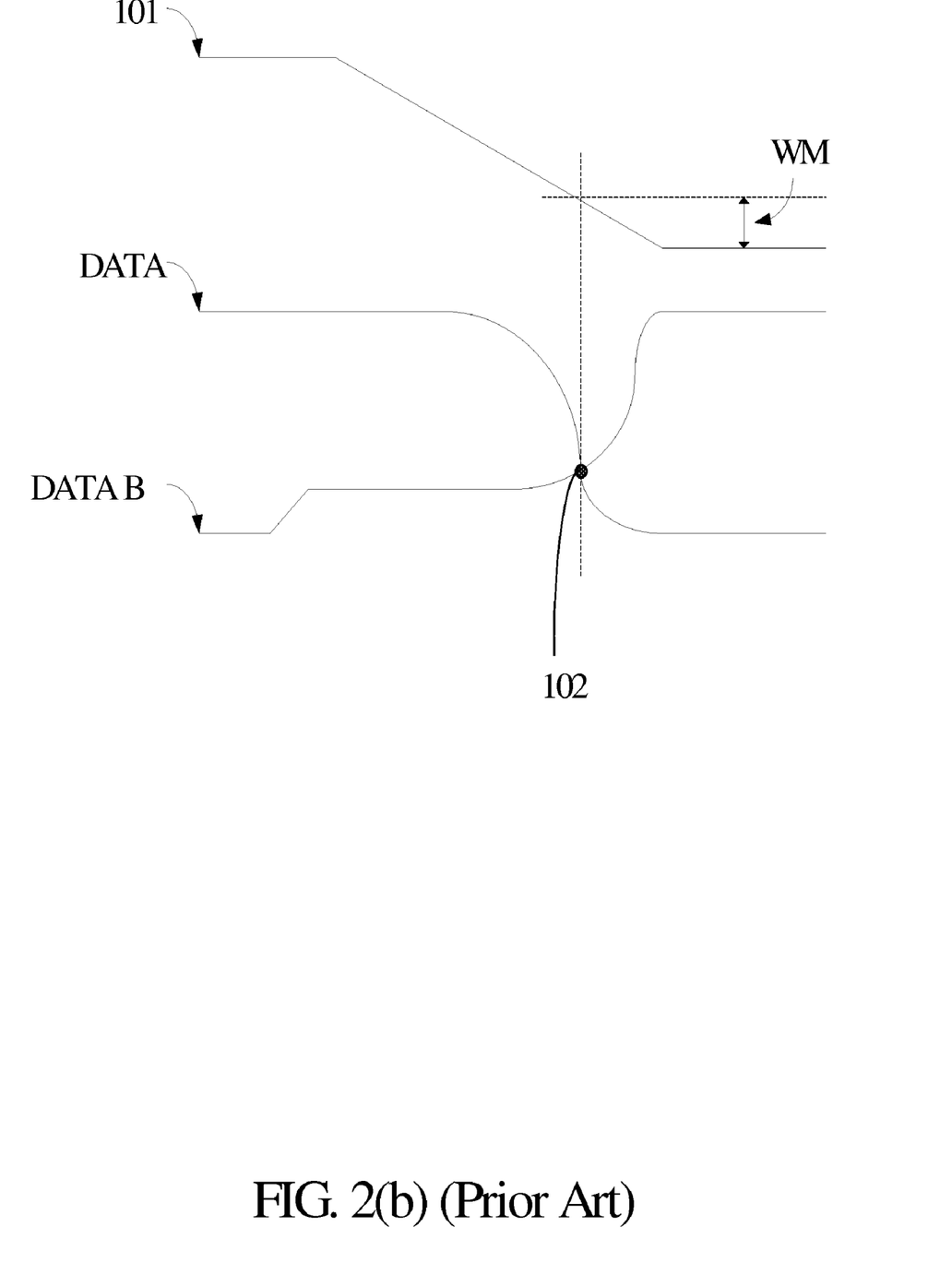
FIG. 2(b) is a schematic partial oscillogram of the conventional SRAM access unit.

The cross-coupled inverters 10, 11 each comprise a pull-up PMOS transistor (i.e., PU1 and PU2) and a pull-down NMOS transistor (i.e., PD1 and PD2). The write operation of the SRAM access unit 1 is described as follows. To write the data to the SRAM access unit 1, one of the bitlines BL and BLB is pulled down to the low voltage level while the other remains at the previously charged voltage level, thus yielding a voltage difference between the bitlines BL and BLB. As a result, data is written into the SRAM access unit 1, i.e., data stored in the SRAM access unit 1 is successfully altered by the bitline that is pulled down to the low voltage level. Next, as shown in both FIGS. 2(a) and 2(b), when "0" is to be written into the SRAM access unit 1 with "1" stored therein, the word line WL turns on the pass transistor 12. At the same time, the voltage 101 of the bitline BL is pulled down, while the voltage (not shown) of the bitline BLB remains at a previously charged voltage. A drop in the voltage at the node DATA represents that the discharging current of the pass transistor 12 is larger than the charging current output from the inverter 10. Once the voltage at the node DATA drops below the input trip point of the inverter 11 (i.e., a mid-point value in the input voltage variation range), the node voltage DATAB begins to rise. The intersecting point 102 between the node voltages DATA and DATAB is defined as the flip point FP. Once the node voltage DATA passes through the SRAM flip point FP, the node voltage DATA becomes lower than the node voltage DATAB, in which case the write operation is successfully accomplished. A write margin WM represents the difference between the bitline signal voltage pulled down to a low value and the ground voltage upon the flip point FP occurring. In other words, a larger write margin means that it is easier to write data into the SRAM. For instance, in this example, when the supply voltage decreases, the flip point will be delayed, which means that the write margin WM will become smaller, making it harder to carry out the write operation.

In summary, conventional SRAM access units tend to experience failed write operations with low voltages. Accordingly, it is important to maintain the normal read and write operation of an SRAM access unit when there is a low voltage, thereby reducing the power consumption of the overall SRAM.

SUMMARY OF THE INVENTION

One objective of this invention is to provide an access unit for an SRAM. The access unit comprises two inverters. Two different variable voltages are supplied through the bitlines to the two inverters respectively, so that there is a voltage trip point imbalance and current imbalance between the two inverters to facilitate the data to be written into the SRAM. Therefore, this invention eliminates the need of a relatively high supply voltage for writing data into a conventional SRAM accessing unit.

The access unit disclosed in this invention consists of metal-oxide-semiconductor (MOS) transistors, and reduces the charging current output from the MOS transistors by changing the voltage difference (Vgs) between the gate and the source of respective MOS transistors to cause the imbalance of output current strengths between the two inverters. As a result, the net discharging current at the output terminal of the inverters are increased during the flipping operation in the write mode to increase the write margin. In this way, a large write margin is still maintained even with a low SRAM supply voltage, thus effectively improving the probability of data being successfully written into the SRAM.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 3:
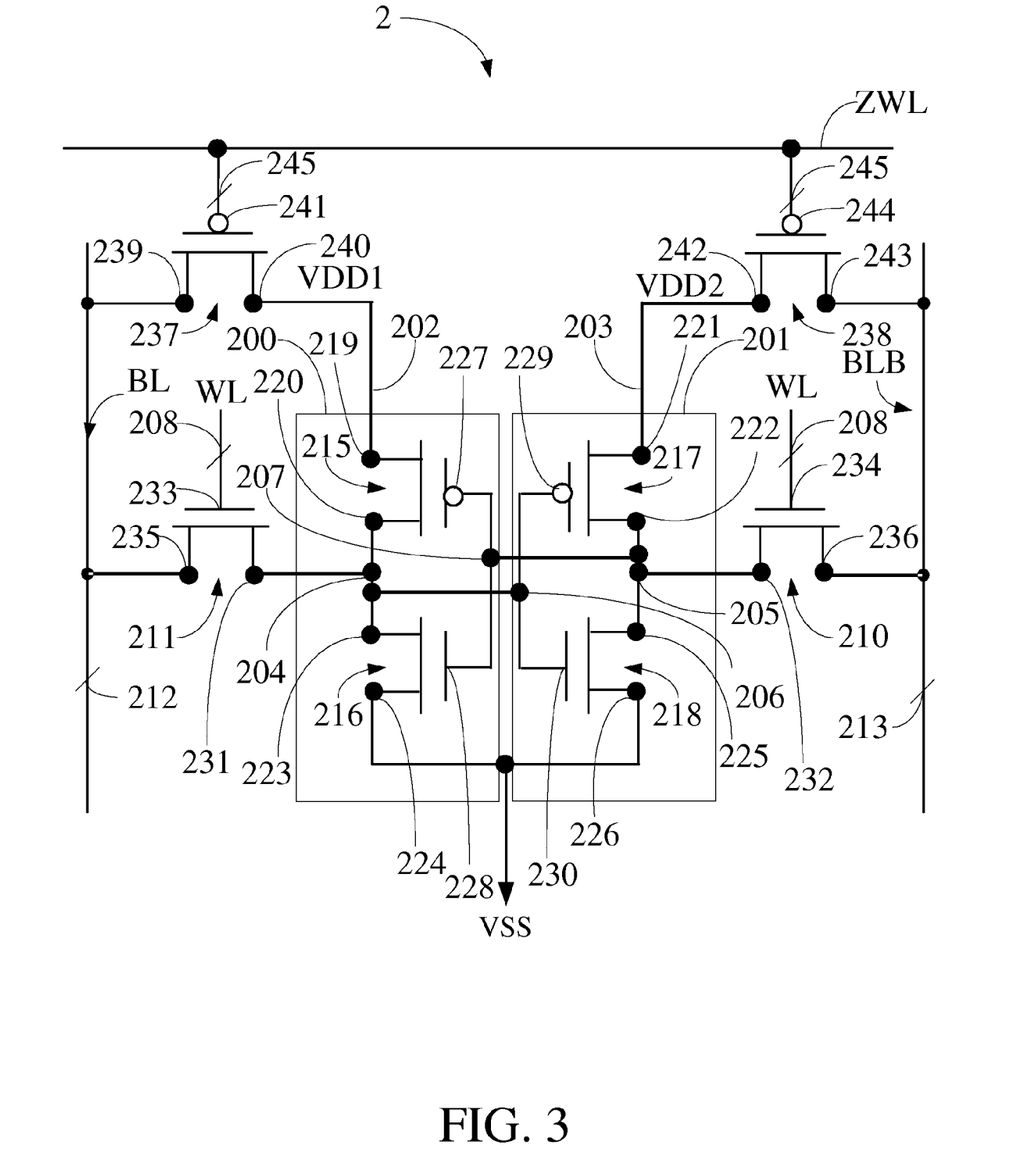
FIG. 3 is a schematic circuit diagram of the preferred embodiment of this invention.

FIG. 3 illustrates a preferred embodiment of this invention, which is an access unit 2 disposed in an SRAM. The access unit 2 comprises a first inverter 200, a second inverter 201, a first MOS transistor 211 acting as a first switching element, a second MOS transistor 210 acting as a second switching element, a first PMOS transistor 237 acting as a first power switching element, and a second PMOS transistor 238 acting as a second power switching element. The first inverter 200 comprises a first power terminal 202, a first output terminal 204 and a first input terminal 207. The second inverter 201 comprises a second power terminal 203, a second output terminal 205 and a second input terminal 206. The first input terminal 207 is electrically connected with the second output terminal 205 to carry a voltage denoted as the node voltage DATAB, while the second input terminal 206 is electrically connected with the first output terminal 204 to carry a voltage denoted as the node voltage DATA.

The first MOS transistor 211 comprises two sources/drains 231, 235 and a gate 233, the second MOS transistor 210 comprises two sources/drains 232, 236 and a gate 234, the first PMOS transistor 237 comprises two sources/drains 239, 240 and a gate 241, and the second PMOS transistor 238 comprises two sources/drains 242, 243 and a gate 244. It should be noted that when an MOS transistor is used as the switching element, the source and drain thereof are only to illustrate the terminals thereof, rather than to specifically represent the carrier-supplying and -draining terminals of the transistor. Therefore, the term "source/drain" is used herein to represent the corresponding terminals of the first MOS transistor 211, the second MOS transistor 210, the first PMOS transistor 237 and the second PMOS transistor 238. The gates 233, 234 receive a switching signal 208 from a word line WL to synchronically turn the first MOS transistor 211 and the second MOS transistor 210 on or off. The gates 241, 244 receive the switching signal 245 from the inverse word line ZWL to synchronically turn the first PMOS transistor 237 and the second PMOS transistor 238 turn on or off. More specifically, in the circuit structure of this embodiment, when the SRAM access unit is selected to be accessed or on standby, the PMOS transistor 237 and the second PMOS transistor 238 are turned on. Otherwise, during the SRAM operation when the SRAM access unit is not selected, the first PMOS transistor 237 and the second PMOS transistor 238 are turned off.

The functions of the first MOS transistor 211 and the second MOS transistor 210 will now be described, after which those of the first PMOS transistor 237 and the second PMOS transistor 238 will be described. The source/drain 231 is connected with the first output terminal 207, while the source/drain 235 is connected with the bitline BL. When the switching signal 208 turns on the first MOS transistor 211, the access unit 2 can be connected to the bitline BL through the first MOS transistor 211 and receive a signal 212 from the bitline BL. Similarly, the source/drain 232 is connected with the second output terminal 205, while the source/drain 236 is connected with the inverse bitline BLB. The inverse bitline BLB carries a signal opposite to that carried by the bitline BL in phase so that when the switching signal 208 turns on the second MOS transistor 210, the access unit 2 can be connected to the inverse bitline BLB through the second MOS transistor 210 and receive a signal 213 from the inverse bitline BLB.

Next, the functions of the first PMOS transistor 237 and the second PMOS transistor 238 will be described. The connections are as follows: the source/drain 240 of the first PMOS transistor 237 is connected with the first power terminal 202; the source/drain 242 of the second PMOS transistor 238 is connected with the second power terminal 203; the source/drain 239 of the first PMOS transistor 237 is connected with the bitline BL; and the source/drain 243 of the first PMOS transistor 238 is connected with the inverse bitline BLB. In this way, when the first PMOS transistor 237 and the second PMOS transistor 238 are turned on, the first power terminal 202 can receive the first variable voltage VDD1 from the bitline BL via the first PMOS transistor 237, while the second power terminal 203 (VDD2) can receive a second variable voltage VDD2, for use as a supply voltage of the access unit 2, from the inverse bitline BLB via the second PMOS transistor 238. The lowest voltage in the circuit is denoted by VSS. By controlling the two variable voltages through the bitline voltages, a charging current output from the first inverter 200 decreases when the first variable voltage VDD1 is lower than the reference value, so that when the first output terminal 204 is switched into the write mode, the net discharging current at the first output terminal 204 thereof will increase. Consequently, the SRAM will exhibit an improved write margin during the write operation, thus increasing the probability of successfully writing into the SRAM. The details about the aforementioned descriptions will be detailed as follows.

The first inverter 200 comprises a PMOS transistor 215 and an NMOS transistor 216, while the second inverter 201 comprises a PMOS transistor 217 and an NMOS transistor 218. Each of these MOS transistors comprises a source, a drain and a gate. The first inverter 200 and the second inverter 201 are cross-coupled in the following way. The first power terminal 202 is connected with the source 219 of the PMOS transistor 215, while the second power terminal 203 is connected with the source 221 of the PMOS transistor 217. The drain 220 of the PMOS transistor 215 and the drain 223 of the NMOS transistor 216 are connected with the first output terminal 204. The drain 222 of the PMOS transistor 217 and the drain 225 of the NMOS transistor 218 are connected with the second output terminal 205, while the gate 227 of the PMOS transistor 215 and the gate 228 of the NMOS transistor 216 are connected with the first input terminal 207. Similarly, the gate 229 of the PMOS transistor 217 and the gate 230 of the NMOS transistor 218 are connected with the second input terminal 206. The source 226 of the NMOS transistor 218 and the source 224 of the NMOS transistor 216 are supplied with the lowest voltage VSS.

The characteristics of the access unit 2 will be described as follows. Also shown in FIG. 4, which assumes that the first PMOS transistor 237 and the second PMOS transistor 238 are turned on (i.e., ZWL stays at a low logic level "0"), the PMOS transistor 215 of the first inverter 200 is turned on, while the NMOS transistor 218 of the second inverter 201 is turned on. When the switching signal 208 carried on the bitline WL transits from the low level to the high level to change the current status of the access unit 2 (i.e., during the enabled period of the access unit 2), the switch signal 208 turns on the first MOS transistor 211 and the second MOS transistor 210. The signal 212 carried on the bitline BL transits gradually from a higher level to a lower level. However, the operation of writing into the access unit 2 must be completed in the write margin.

Figure 4:
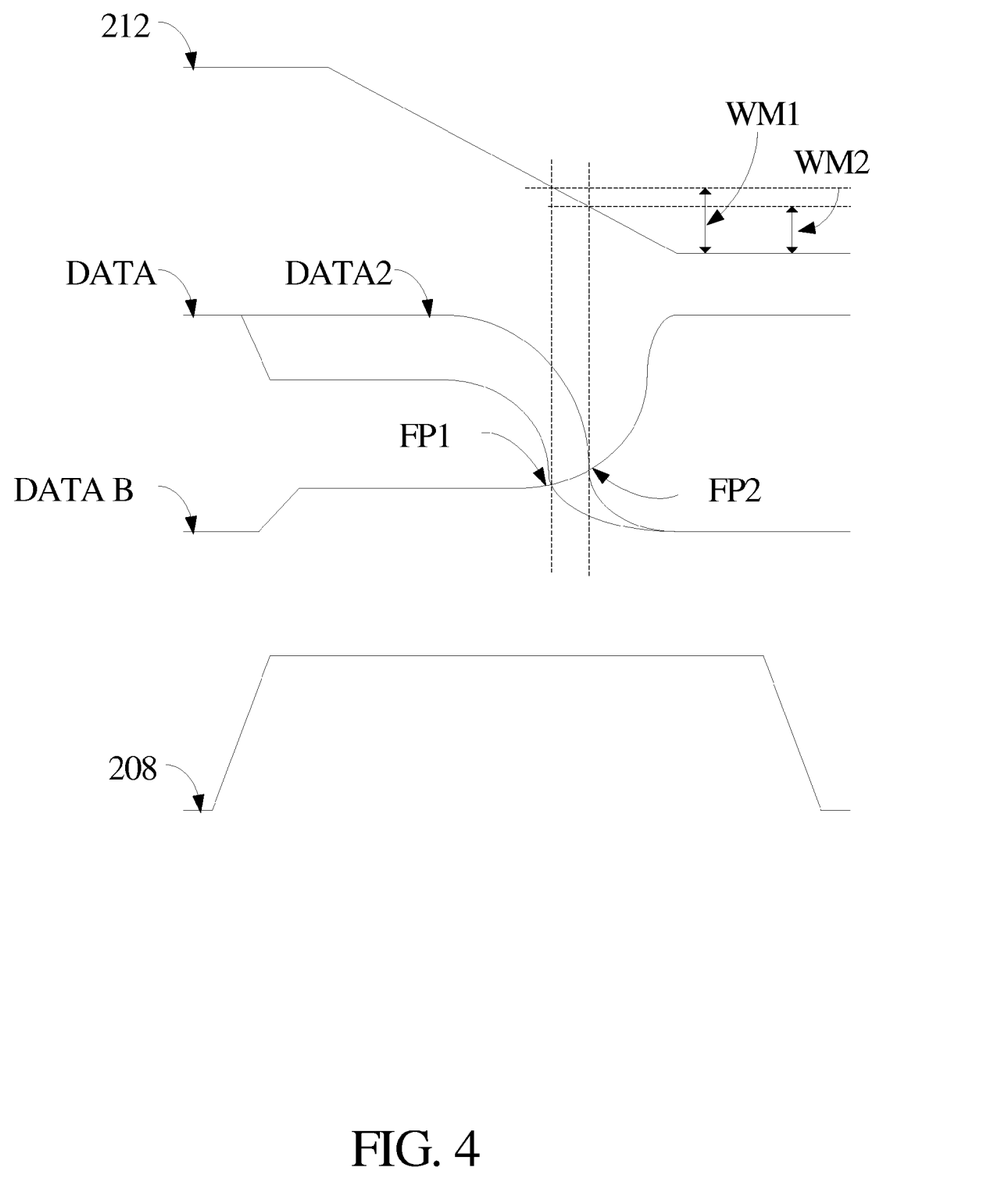
FIG. 4 is a oscillogram of the preferred embodiment.

At this point, the bitline BL enables the first variable voltage VDD1 to decrease below the steady-state voltage thereof (i.e., the steady-state voltage is used as a reference value). When the status of the access unit 2 before being written is different from that after being written (i.e., the SRAM is to flip). When the VDD1 is lower than the reference value, the voltage difference across the source 219 and the gate 227 of the PMOS 215 will be decreased, and accordingly, the charging current output from the PMOS 215 is decreased (i.e., the charging current of the first inverter 200 is decreased). As a result, the net discharging current at the first output terminal 204 is increased, while the trip point of the first inverter 200 becomes lower compared to that of the prior write operation, thereby facilitating the flipping of the access unit 2. The variation of the node voltages DATA and DATAB in this case are as illustrated in FIG. 4, where the node voltage waveform DATA2 represents the node voltage before the first variable voltage VDD1 is decreased. By decreasing the first variable voltage VDD1, the flip point FP1 happens earlier than the flip point FP2, i.e., a larger write margin is obtained. Accordingly, in FIG. 3, the write margin WM1 is significantly larger than the write margin WM2.

Figure 5:
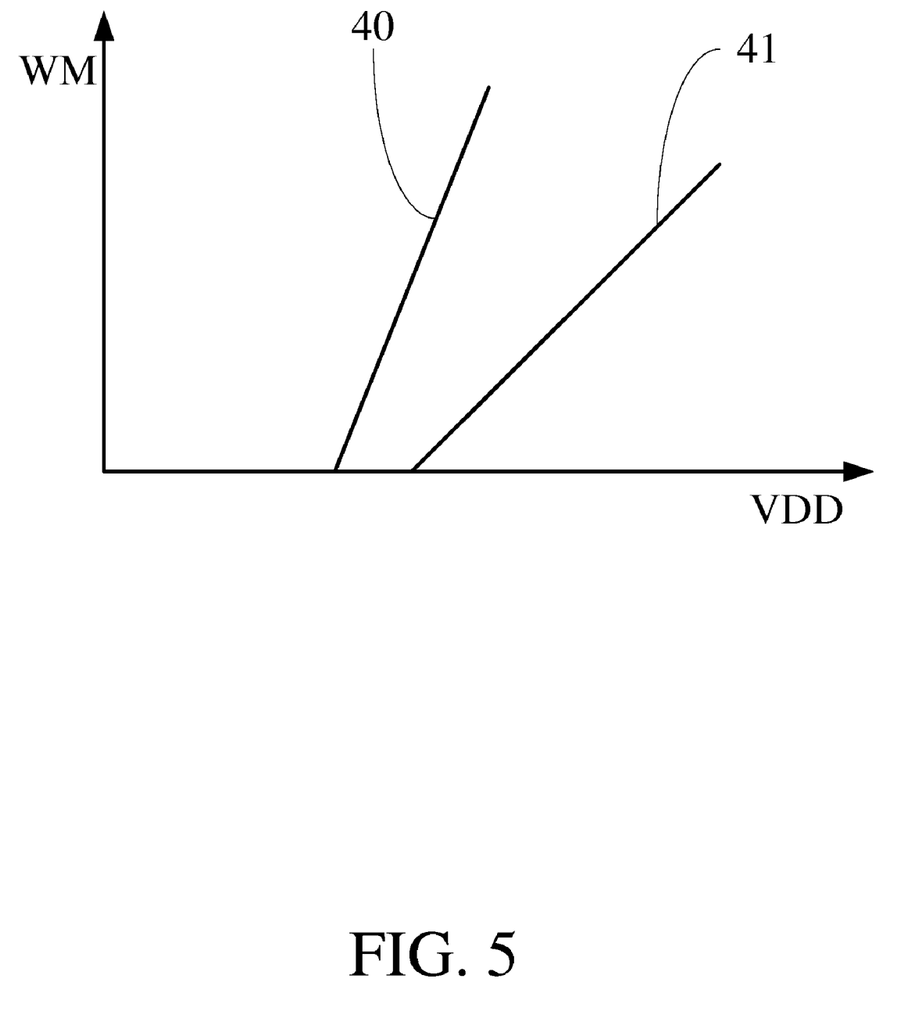
FIG. 5 is a schematic graph of the steady-state voltage versus the write margin of the preferred embodiment and conventional access unit.

Likewise, when the second variable voltage VDD2 is decreased, the charging current output from the second inverter 201 is decreased, and accordingly the discharging current of the node DATAB is increased, thus facilitating the variation of the voltage at the node DATAB. To enhance the current imbalance between the first inverter 200 and the two inverters 201 in expectation of a larger write margin, the second variable voltage VDD2 may be higher than or equal to the steady-state voltage thereof when the first variable voltage VDD1 is lower than the stead-state voltage thereof. Similarly, when the second variable voltage VDD2 is lower than the steady-state voltage thereof, the first variable voltage VDD1 may be enabled to be higher than or equal to the steady-state voltage thereof. To illustrate the efficacy of this invention more clearly, please refer to FIG. 5. In FIG. 5, the horizontal axis VDD represents the different steady-state voltages, the vertical axis WM represents the values of a write margin, and the tendency line 40 represents the variation of the write margin under different steady-state voltages for the access unit of this invention. The tendency line 41 represents the variation of the write margin under the different steady-state voltages for a conventional access unit. It can be seen from FIG. 5 that the access unit of this invention exhibits a larger write margin than the conventional access unit at a same steady-state voltage, and requires a lower steady-state voltage than the convention access unit to obtain the same write margin.

The detailed description will be made with reference to an example where the access unit 2 flips from "1" to "0", which means that the SRAM operates in a write mode, and the original status is "0". Prior to the flip, both the first variable voltage VDD1 supplied by the first power terminal 202 to the first inverter 200 and the second variable voltage VDD2 supplied by the second power terminal 203 to the second inverter 201 are equal to the steady-state voltages thereof. When the access unit 2 is flipped from "1" to "0", the first variable voltage VDD1 must be decreased to be lower than the steady-state thereof during the enabled period of the bitline 208 (i.e., when the first MOS 211 and the second MOS 210 are turned on), while the second variable voltage VDD2 must remain unchanged or be increased during this enabled period of the bitline 208 to be higher than or equal to the steady-state voltage thereof. Therefore, when the SRAM operates in the write mode without the need to flip, the current of the inverters remains unchanged.

When the other SRAM cells are not accessed in the SRAM operating mode, the first PMOS 237 and the second PMOS 238 are turned off (i.e., ZWL stays at a high logic level "1"). In this case, both the first variable voltage VDD1 and the second variable voltage VDD2 float at the steady-state voltages thereof. Therefore, the unselected SRAM cells are free from interference from the bitlines.

When the SRAM operates in a standby mode, both the bitline BL and the inverse bitline BLB stay at the steady-state voltages thereof, and the first PMOS 237 and the second PMOS 238 are turned on (i.e., ZWL stays at a low logic level "0"). Therefore, the SRAM cells are supplied with a continuous voltage supply to maintain data in the constant status.

In summary, a large write margin is maintained by disposing the access unit of this invention in an SRAM. Consequently, at low voltage conditions, two different variable voltages can be supplied through the bitlines to two inverters respectively in the SRAM, so that an imbalance is caused between the current strengths of the two inverters for successfully writing data on the SRAM. Therefore, when used for an SRAM, the access unit of this invention can effectively eliminate the need of a relatively high supply voltage for writing data into a conventional SRAM.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An access unit for a static random access memory (SRAM), comprising:
    a first inverter, comprising a first power terminal, a first input terminal and a first output terminal;
    a second inverter, comprising a second power terminal, a second input terminal and a second output terminal;
    a first power switching element; and
    a second power switching element;
    wherein the first input terminal is electrically connected with the second output terminal, the second input terminal is electrically connected with the first output terminal, the first power terminal is electrically connected with the first power switching element and receives a first variable voltage through the first power switching element, the second power terminal is electrically connected with the second power switching element and receives a second variable voltage through the second power switching element, and when a status of the SRAM flips transforms and the first variable voltage is smaller than a reference value, an output charging current of the first inverter is decreased so that a discharging current at the first output terminal when transforming is increased.

2. The access unit as claimed in claim 1, wherein each of the first inverter and the second inverter comprises a P-type metal-oxide-semiconductor (PMOS) transistor and an N-type metal-oxide-semiconductor (NMOS) transistor, each of the PMOS and NMOS transistors comprises a source, a drain and a gate, wherein:
    the first power terminal is connected with the source of the PMOS transistor of the first inverter;

the second power terminal is connected with the source of the PMOS transistor of the second inverter;

the drain of the PMOS transistor and the drain of the NMOS transistor of the first inverter are connected with the first output terminal, and the drain of the PMOS transistor and the drain of the NMOS transistor of the second inverter are connected with the second output terminal; and the gate of the PMOS transistor and the gate of the NMOS transistor of the first inverter are connected to the first input terminal, and the gate of the PMOS transistor and the gate of the NMOS transistor of the second inverter are connected with the second input terminal; and the source of the NMOS transistor of the first inverter and the source of the NMOS transistor of the second inverter are connected to a lowest voltage.

3. The access unit as claimed in claim 1, wherein the second variable voltage is equal to the reference value when the first variable voltage is smaller than the reference value.

4. The access unit as claimed in claim 1, wherein the second variable voltage is greater than the reference value when the first variable voltage is smaller than the reference value.

5. The access unit as claimed in claim 2, further comprising a first switching element, a second switching element, a bitline and an inverse bitline, wherein the first output terminal is connected with the bitline through the first switching element, the second output terminal is connected with the inverse bitline through the second switching element, and a signal carried on the inverse bitline is opposite in phase to a signal carried on the bitline.

6. The access unit as claimed in claim 5, wherein the switching elements are MOS transistors each having a gate and two source-drains, wherein:

the gates are configured to receive a switching signal from a word line to turn on or turn off the switching elements synchronously;

one of the source-drains of the first switching element is connected with the first output terminal, and the other of the source-drains of the first switching element is connected with the bitline; and one of the source-drains of the second switching element is connected with the second output terminal, and the other of the source-drains of the second switching element is connected with the inverse bitline.

7. The access unit as claimed in claim 5, wherein the first variable voltage is smaller than the reference value when the signal carried on the bitline changes.

8. The access unit as claimed in claim 5, wherein the first power switching element and the second power switching element each comprises two source-drains and a gate, each of the gates is electrically connected with an inverse word line to control turn-on of the power switching elements; one of the source-drains of the first power switching element is connected with the source of the PMOS transistor of the first inverter, and the other of the source-drains of the first power switching element is connected with the bitline, so that when the first power switching element is turned on, the bitline supplies the first variable voltage to the first inverter; one of the source-drains of the second power switching element is connected with the source of the PMOS transistor of the second inverter, and the other of the sources/drains of the second power switching element is connected with the inverse bitline, so that when the second power switching element is turned on, the inverse bitline supplies the second variable voltage to the second inverter.

9. The access unit as claimed in claim 8, wherein each of the power switching elements is a PMOS transistor.

* * * * *